United States Patent [19]
Esser

[11] 4,012,759
[45] Mar. 15, 1977

[54] BULK CHANNEL CHARGE TRANSFER DEVICE

[75] Inventor: Leonard Jan Maria Esser, Eindhoven, Netherlands

[73] Assignee: U.S. Philips Corporation, New York, N.Y.

[22] Filed: Nov. 10, 1975

[21] Appl. No.: 630,538

Related U.S. Application Data

[63] Continuation of Ser. No. 450,996, March 14, 1974, abandoned.

[30] Foreign Application Priority Data

Mar. 19, 1973 Netherlands ............... 7303778

[52] U.S. Cl. ................. 357/24; 307/221 D; 357/89
[51] Int. Cl.² ............... H01L 29/78; G11C 19/28
[58] Field of Search .......... 357/24; 307/221 D, 304

[56] References Cited

UNITED STATES PATENTS

| | | | |
|---|---|---|---|
| 3,767,983 | 10/1973 | Berglund | 357/24 |
| 3,784,847 | 1/1974 | Kurz et al. | 357/24 |
| 3,789,267 | 1/1974 | Krambeck et al. | 357/24 |
| 3,792,322 | 2/1974 | Boyle et al. | 357/24 |
| 3,796,932 | 3/1974 | Amelio et al. | 357/24 |
| 3,852,799 | 12/1974 | Walden | 357/24 |

OTHER PUBLICATIONS

Erb et al., "An Overlapping Electrode Buried Channel CCD" IEEE Int. Electron Device Meeting Tech. Dig. (Dec. 1973) pp. 24–26.
Anantha et al., "Unidirectional Charge–Coupled Shift Register" IBM Tech. Disclosure Bull. vol. 14 (Sept. 1971) p. 1234.

*Primary Examiner*—William D. Larkins
*Assistant Examiner*—Gene M. Munson
*Attorney, Agent, or Firm*—Frank R. Trifari; Jack Oisher

[57] ABSTRACT

The invention relates to a charge-coupled device with charge transport in the bulk of the semiconductor body. The semiconductor layer in which the transport takes place comprises a comparatively low-ohmic surface zone present below the electrodes and an adjoining comparatively high-ohmic layer present below the surface zone. A comparatively large number of charge carriers can be concentrated in the surface zone with a comparatively low clock voltage. The last fraction of charge carriers to be transferred which mainly determine the transport rate can be transported from one storage space to the next storage space via the high-ohmic layer at a large distance from the electrodes and hence in a very short time.

16 Claims, 10 Drawing Figures

BULK CHANNEL CHARGE TRANSFER DEVICE

This is a continuation of application Ser. No. 450,996, filed Mar. 14, 1974 now abandoned.

The invention relates to a charge-coupled device of the type having a semiconductor body comprising a semiconductor layer of one conductivity type, in which means are present to insulate the semiconductor layer from the surroundings and said layer has a thickness and a doping concentration in which a depletion zone can be obtained throughout the thickness of the semiconductor layer by means of an electric field while avoiding breakdown. Means are also present to locally introduce into the semiconductor layer information in the form of charge consisting of majority charge carriers and means to read-out said information elsewhere in the semiconductor layer, an electrode system for the capacitive generation of electric fields in the semiconductor layer being present on at least one side of the layer by means of which the charge can be transported to the reading means through the semiconductor layer in a direction parallel to the layer.

The term "electrode system" should be understood to have a very wide meaning so that not only electrodes which are isolated from the semiconductor layer by a barrier layer are included, but also other means, for example, a piezo-electric layer, with which electric fields can be formed in the semiconductor layer. The term "majority charge carriers" means in the usual way the free carriers that predominate in the one-type layer, for example, electrons for an N-type layer.

Such a semiconductor device is described in the non-prepublished Dutch Patent Application No. 7,114,770. The transport of the electric charge in said semiconductor device takes place mainly via the interior or bulk of the semiconductor layer. In this respect, a semiconductor device of the type as described in the said Dutch Patent Application differs from the generally known charge-coupled devices in which the storage and the transport of the electric charge takes place at the surface of the semiconductor layer. Since in general the mobility of electric charge carriers as a result of surface states at the surface of the semiconductor layer is lower than in the interior of the semiconductor layer and since in general the distance between the electrode members and the electric charge in the interior of the semiconductor layer is comparatively large and hence the capacitive coupling between said charge and the electrode is comparatively small, the charge transport of electric charge via the interior of the semiconductor layer will be rapid relative to the charge transport of a corresponding quantity of charge along the surface of the semiconductor layer.

As a result of this, a semiconductor device of the above-described type can be operated by means of clock voltages having a comparatively high frequency. One of the advantages is that, for example, when using such a semiconductor device in delay lines for video frequency signals, the maximum frequency of said video signals to be conveyed through the shift register can be comparatively high.

Moreover, the transport efficiency upon transporting electric charge through the layer in a semiconductor device of the type described in the preamble can be very high so that only little crosstalk occurs between successive charge packets which are transported through the layer one after the other. This is of great importance in particular when using a semiconductor device as an image sensor for converting electromagnetic radiation into electrical energy.

In most of the cases the semiconductor layer is formed by a surface layer which adjoins a surface of the semiconductor body and which is covered at said surface by an insulating layer of, for example, silicon oxide and is bounded by a reversely-biased p-n junction on the side opposite to the said surface. The lateral isolating of the semiconductor layer may be formed, for example, by means for isolating the islands, for example, a reversely-biased p-n junction, generally used in integrated semiconductor devices. The members by means of which clock voltages can be applied in the semiconductor layer usually consist of electrodes which are provided on the insulating layer and are separated from the semiconductor layer by the insulating layer.

During operation, information in the form of a packet of majority charge carriers can be stored in a first region of the semiconductor layer opposite to a first electrode and be separated from other charge packets by means of electric fields in depletion zones which enclose said region and extend across the semiconductor layer. During the charge transport the charge carriers of the said charge packet are transported from the first region of the semiconductor layer to a next region of the semiconductor layer by applying a voltage difference between said electrode and the next electrode, the charge carriers flowing at least mainly via the interior of the semiconductor layer from the first-mentioned region to the next region until the whole first region of the semiconductor layer is depleted. The doping concentration and the thickness of the semiconductor layer should of course be so low that the semiconductor layer can be depleted throughout its thickness without avalanche multiplication occurring. Such a low-doped layer can be formed, for example, as stated in the above-mentioned Dutch Patent Application, by a homogeneously doped high-ohmic epitaxial layer which is provided on a support or substrate of the opposite conductivity type.

Generally, the clock voltages to be applied to the electrodes are preferably maintained as small as possible because, according as the clock voltages become larger, inter alia the dissipation also becomes larger. Besides of course by material properties such as the dielectric constants of the insulating layer and the semiconductor layer, the value of the clock voltages is inter alia determined by the value Q of the quantity of charge to be transported. According as Q is larger, the clock voltages to be applied to the electrodes should also be larger so as to prevent charge from being lost and/or from disappearing to a region of the semiconductor layer comprising further information so that crosstalk between information-containing regions can occur. In addition, dependent upon the velocity at which the charge is to be transported, fields of a sufficient value preferably remain in the transport direction. A further important quantity which determines the magnitude of the clock voltages is the distance between the electrodes and the charge. According as said distance is larger — which means that the charge and the electrodes are more decoupled capacitively relative to each other — the clock voltages to be applied to the electrodes will also have to be larger so as to prevent, with a given charge Q, spreading of said charge.

When a semiconductor device of the type described in the preamble in which the charge transport takes place mainly via the interior of the semiconductor layer is compared with a semiconductor device of the more conventional type also already described in which the charge storage and the charge transport take place at and along the surface of the semiconductor layer — and assuming that in both cases the thickness of the barrier layers between the electrodes and the layer are equal — then it appears that in a semiconductor device of the first-mentioned type generally larger voltages are necessary than in a semiconductor device of the last-mentioned type in order to transport a charge Q of a given value through the semiconductor layer.

It is one of the objects of the present invention to provide a semiconductor device in which the charge is transported at least for the greater part in the interior of the semiconductor layer with all the advantages associated therewith, while nevertheless the clock voltages are comparable to those which would be used in case the charge would be transported along the surface.

As already described, surface states which may serve inter alia as traps or as recombination centers for the charge carriers and which hence can exert an unfavorable influence on the operation of the semiconductor device, in particular in the case in which same is used as a picture recording device, are present at the interface between the semiconductor layer and the insulating layer. Therefore it may often be advantageous to operate the semiconductor device in such manner that the charge to be transported through the semiconductor layer constantly remains in the interior of the semiconductor layer at a sufficiently large distance from the surface, also during the charge storage periods. However, such a way of operation of the semiconductor device imposes extra requirements and restrictions upon the clock voltages which are to be aplied to the electrodes and/or upon the maximum quantity of charge to be transported through the semiconductor layer.

It is therefore a further object of the present invention to provide a semiconductor device of the type described in the preamble in which with given clock voltages a comparatively large quantity of charge can be transported through the layer without accumulation of charge at the surface occurring.

The invention is inter alia based on the recognition that the potential wells which should be formed in the semiconductor layer to confine the charge to be transported through the semiconductor layer can be influenced, as regards the depth of the potential minima and/or the distance of said minima to the surface of the semiconductor layer, not only by the voltage applied to the electrodes, but also by the doping concentration of the semiconductor layer. The invention is furthermore based on the recognition that in a semiconductor layer having a non-uniform doping concentration, charge concentration can be obtained in places in the semiconductor layer also determined by the doping concentration profile.

According to the invention, a charge-coupled device of the type described in the preamble is characterized in that the semiconductor layer comprises at least locally below the electrode system a surface zone of one conductivity type which is more highly doped than the adjoining part of the semiconductor layer and which extends in the semiconductor layer only over a part of the thickness of the semiconductor layer.

Due to the presence of the more highly doped surface zone — as a result of which in fact the capacity which forms a stage of the charge-coupled device is increased — the greater part of the information-containing charge can be localised comparatively close to the electrode system. Although as a result of this the transport also occurs comparatively close to the electrode system so that the capacitive coupling between the charge and the electrode system is comparatively large the transport time or transport rate, however, is influenced only to a small extent by said stronger capacitive coupling since the transport time is determined mainly only by the last fractions of charge still to be transferred. These last fractions can each time be transferred very rapidly via the lower-doped part of the semiconductor layer below the surface zone where the charge is coupled more weakly capacitively as a result of the larger distance to the electrode system than in the more highly doped surface zone of the semiconductor layer.

Since, however, as a result of the presence of the more highly doped surface zone the greater part of the charge to be transported through the semiconductor layer can be concentrated comparatively close to the electrode system, a semiconductor device according to the invention can be operated with smaller clock voltages than a semiconductor device of the type described in the preamble comprising a semiconductor layer having a uniform doping. These clock voltages are comparable to those which would be used in the case in which the charge would be transported entirely along the surface.

In addition, a comparatively large quantity of information-containing charge can be concentrated in the interior or bulk of the layer at a readily defined distance from the surface — which usually is formed by a surface of the body — as a result of the higher doping in the more highly doped surface zone, in which interior the concentration of generation centers and/or traps can be much smaller than at the surface.

It is to be noted that the invention is of course not to be restricted to embodiments in which the charge is always concentrated at a finite distance from the surface of the semiconductor layer. It is possible, for example, that in a charge-coupled device according to the invention, the semiconductor layer, apart possibly from the input or the output of the device, does not at all adjoin a surface of the semiconductor body but, for example, changes into a surface-adjoining semiconductor region of the opposite conductivity type via a reverse-biased p-n junction, the electrode system being provided on said semiconductor region of the opposite conductivity type. In this embodiment the charge is always in the interior of the semiconductor body, also if a part of the charge adjoins the surface of the layer.

The electrode system for generating electric fields in the semiconductor layer may comprise inter alia a piezoelectric layer in which an acoustic wave can be converted into and electric wave. A simple preferred embodiment of a charge-coupled device according to the invention is characterized in that the said electrode system comprises a number of electrodes which are separated from the semiconductor layer by a barrier layer. The electrodes may be formed, for example, by semiconductor zones of the conductivity type opposite to that of the semiconductor layer which form, with the semiconductor layer, a barrier layer in the form of p-n junction. The semiconductor layer may advantageously be bounded in the lateral direction and isolated by an insulation zone which consists at least partly of insulating material, for example silicon oxide, which is inset in the semiconductor layer over at least a part of its thickness. Furthermore, barrier layers in the form of rectifying metal-semiconductor junctions or Schottky-junctions biased in the reverse direction may be used in which an electrode consists of a metal layer which is suitable for the formation of a Schottky junction and which may be provided directly on the surface of the semiconductor layer. However, a preferred embodiment of the semiconductor device according to the invention is characterized in that the electrodes are formed by conductive layers which are separated from the semiconductor layer by an insulating layer. The conductive layers may be formed by metal layers, for example of aluminum. However, instead of metals other materials, such as polycrystalline silicon which is doped or not doped with an impurity to reduce the resistance, may also be used.

A preferred embodiment which inter alia has the advantage that the manufactor is simple is characterized according to the invention in that the semiconductor layer has a layer-shaped surface zone of one conductivity type which extends substantially along the whole surface of the semiconductor layer. The surface zone and the adjoining lower-doped region can advantageously be constructed in the form of epitaxial layers of the same conductivity type but of provided one on the other. The doping concentrations and the thicknesses of the more highly doped surface zone and the adjoining lower-doped part of the semiconductor layer may be chosen within wide limits. In addition, the semiconductor layer in said preferred embodiment can be manufactured in manners conventionally used in semiconductor technology for providing epitaxial semiconductor layers.

The supporting member on which the semiconductor layer is provided may be formed, for example, by a body of insulating material, for example, aluminum oxide or sapphire. The supporting member may advantageously also consist of a semiconductor substrate of the same conducitivty type as the semiconductor layer in which a number of electrodes in the form of buried zones of the opposite conductivity type may be provided at the interface between the semiconductor layer and the substrate. Voltages should be applied to the electrodes such that at the interface between the semiconductor layer and the substrate a depletion region is formed which prevents conduction between the layer and the substrate. During the manufacture of such a semiconductor device the more highly doped surface zone in the form of a first epitaxial layer may first be grown on the substrate with a comparatively high doping concentration and then the adjoining lower-doped part in the form of a second epitaxial layer having a comparatively low doping concentration.

An important preferred embodiment of the semiconductor device according to the invention is characterized in that at least the said adjoining part of the semiconductor layer is formed by an epitaxial layer of one conductivity type which is provided on a semiconductor substrate of the opposite conductivity type. The manufacture of a device according to said embodiment is particularly simple. After providing the epitaxial layer on the substrate, said layer may be provided with the more highly doped surface zone, for example, by increasing, at least locally along the surface, the concentration of the impurities, for example, by means of ion implantation. However, the more highly doped surface zone may also be provided in the form of a second epitaxial layer on the first, the lower doped region forming the epitaxial layer.

A further advantage of the above-described preferred embodiment of a charge-coupled device according to the invention in which the more highly doped surface zone extends along substantially the whole surface of the semiconductor layer is that with given mutual distances between the electrodes the effect of possible potential wells which may occur in the semiconductor layer, in particular at the surface of the semiconductor layer between the electrodes, is reduced in that, due to the higher doping of the surface zone, the charge is concentrated at a finite distance which is determined more by the thickness of the surface zone than by interelectrode potential wells. The possibility that the said potential wells occur can be reduced by incorporating in and/or near the parts of the semiconductor layer present between the electrodes extra charge of the same polarity as the information-forming majority carriers to be transported through the semiconductor layer. For that purpose, a further preferred embodiment of a charge-coupled device according to the invention in characterized opposite conductivity type which, viewed on the surface, are present between the electrodes and extend in the semiconductor layer over a part of the thickness of the semiconductor layer. During operation, said zones can be depleted entirely or partly and represent therewith a quantity of ionised change of the same polarity as the information containing majority charge carrier to be transported through the semiconductor layer and thus prevent said information-containing charge carriers from being retained partly in potential wells.

A further preferred embodiment of a chargecoupled device according to the invention is characterized in that the doping concentration of the said surface zone is at least approximately 10 times and preferably at least 100 times higher than the doping concentration of the said adjoining part of the semiconductor layer.

The thickness of the more highly doped surface zone is advantgeously chosen to be at most equal to the thickness of the adjoining lower-doped part and preferably smaller than half the thickness of said part of the semiconductor layer.

The invention will now be described in greater detail with reference to a few embodiments and the accompanying diagrammatic drawing, in which:

FIG. 1 is a diagrammatic plan view of a part of a charge-coupled device according to the invention and of which

Figure 1:
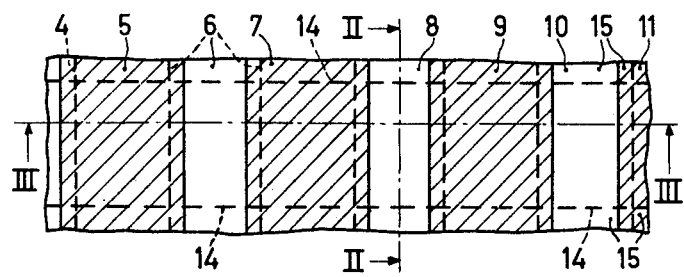

FIG. 1 is a plan view of a charge-coupled device (sometimes referred to by the English names of "Charge Coupled Device" and "Charge Transfer Device" or as CCD and CTD, respectively) of a type which has been described in the already mentioned non-prepublished Dutch Patent Application No. 7,114,770. The device comprises a semiconductor body 1 (see FIGS. 2, 3) having a semiconductor layer 2 of n-type silicon.

Except possibly for the introduction and the reading-out of the charge to be transported through the device, the semiconductor layer 2, at least during operation, may be isolated from the surroundings. For that purpose, means are present which are formed, for example, by an insulating layer 12 by means of which the layer 2 is insulated from the surroundings on the side 3, while on the oppositely located side and the side edges, respectively, the layer 2 can be isolated by p-n junctions 13 and 14, respectively, cut-off during operation. However, the isolation may also be obtained differently. For example, the p-type isolation zone 15 (see FIG. 2) which forms the p-n junction 14 with the layer 2, may be replaced entirely or partly by a layer of insulating material, for example, silicon oxide, which is inset in the layer 2 over part of its thickness. In FIG. 1 the p-n junction 14 which thus forms the lateral boundary of the layer 2 is denoted by broken lines.

The layer 2 which serves as the information channel of the device has a thickness and a doping concentration at which a depletion zone can be formed throughout the thickness of the layer 2 by means of an electric field while avoiding breakdown. Such a breakdown may consist, for example, of an avalanche multiplication in the layer 2. Furthermore, means are present to locally introduce into the semicondutor layer 2 information in the form of charge consisting of majority charge carriers. These means may comprise, for example, a contact 31 on the semiconductor layer to be connected to an electric signal source. However, the said means may also comprise an electromagnetic source of radiation, radiation emitted by said source being converted into charge carriers after absorption in the semiconductor layer 2.

Means are furthermore present to read-out said charge elsewhere in the layer 2. These means may comprise, for example, an ohmic connection contact 32.

On the side 3 of the semiconductor layer 2 an electrode system 4–11 is present for the capacitive generation of electric fields in the layer 2 by means of which the charge can be transported to the said reading means through the semiconductor layer 2 in a direction parallel to the layer 2.

The electrode system may comprise, for example, a piezo-electric layer with which an acoustic wave can be converted into an electric wave. In the present embodiment, however, the electrode system comprises a number of electrodes 4–11 which are separated from the semiconductor layer 2 by a barrier layer 12 of silicon oxide. The layer 12 which usually is transparent is not shown in FIG. 1 for clarity.

Figure 3:
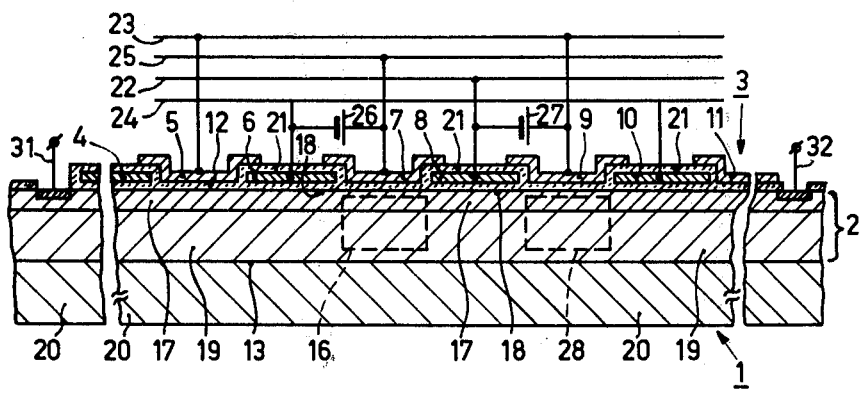
FIG. 3 is a cross-sectional view taken on the line III—III of FIG. 1.

The edges of the electrodes 4, 6, 8 and 10 which, as shown in FIG. 3, are present below the electrodes 5, 7, 9 and 11 are shown in broken lines in FIG. 1. As shown in FIGS. 1 and 3, the electrodes 4–11 extend in a direction transverse to the direction of charge transport throughout the width of the semiconductor layer 2.

Figures 2, 4:
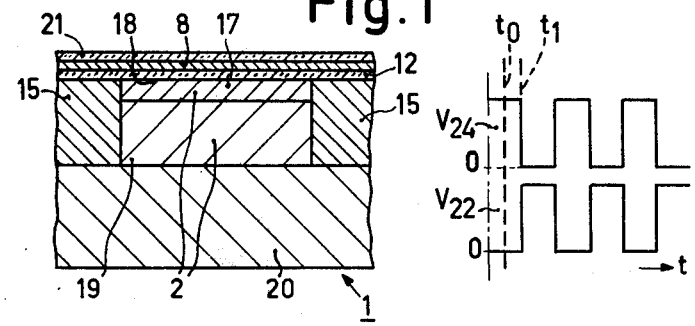
FIG. 2 is a cross-sectional view taken on the line II—II of FIG. 1.
FIG. 4 shows the clock voltages which are placed on the electrodes in the device shown in FIG. 1 to 3 in accordance with time.

As shown in FIGS. 2 and 3, the semiconductor layer 2 below the electrodes 4–11 comprises an n-type surface zone 17 which is more highly doped than the adjoining N-type part 19 of the semiconductor layer 2. The surface zone 17 and adjoining part 19 form a double layer channel 2.

As shown in FIGS. 2 and 3, the surface zone 17 extends downward in the semiconductor layer 2 only over a part of the thickness of said layer 2.

In the present embodiment, the semiconductor layer 2 comprises a layer-shaped surface zone 17 which extends substantially along the whole surface 18 of the semiconductor layer 2.

The surface zone 17 and the adjoining part 19 of the semiconductor layer 2 can simply be formed by n-type epitaxial layers which are provided one on the other and have mutually different doping concentrations. In the present embodiment, the lower doped part 19 of the layer 2 is deposited in the form of an epitaxial layer on the substrate 20 of p-type silicon, and more highly doped surface zone 17 is deposited in the form of a second epitaxial layer on the lower doped region 19.

As shown in FIGS. 1 and 3, the electrodes 4–11 overlap each other partly so that the mutual effective distances between the electrodes can be very small. Such an electode system can be obtained by means of known technologies in which for the electrodes 4, 6, 8 and 10 polycrystalline silicon is used, for example, and for the electrodes 5, 7, 9 and 11 a metal, for example, aluminum is used. The mutual electric insulation between on the one hand the electrodes 4, 6, 8 and 10 and the electrodes 5, 7, 9, 11 on the other hand can be obtained by partly oxidizing the polycrystalline silicon as a result of which the silicon oxide layer 21 is obtained.

As is shown in FIG. 3, the electrodes are sub-divided into four groups in which the electrodes 4 and 8 belong to a first group of electrodes which are connected together by the clock voltage line 22, the electrodes 5 and 9 belong to a second group of electrodes which are connected together by the clock line 23, the electrodes 6 and 10 belong to a third group of electrodes which are connected together by the clock line 24, and the electrodes 7 and 11 belong to the fourth group of electrodes which are connected together by the clock line 25.

A direct voltage source 26 shown diagrammatically is connected between the electrodes belonging to the line 24 and the electrodes belonging to the line 25, while a direct voltage source 27 shown diagrammatically is connected between the electrodes belonging to the line 22 and the electrodes belonging to the line 23. The voltage sources 26 and 27 each supply a voltage of approximately 5 volts. The voltage sources 26 and 27 cause an asymmetry in the system and hence a preferred direction for the charge transport, as a result of which the device can be operated as a two-phase charge-coupled device. During operation, for example, the clock voltage lines 22 and 24 are connected to voltage sources not shown by means of which the clock voltages V22 and V24, respectively, shown in FIG. 4 can be applied to the clock lines 22 and 24, respectively. The clock voltages V22 and V24 each show two levels, a low level of approximately 0 volt and a high level of approximately 10 volts, the level of 0 volt corresponding to the potential which is applied to the substrate 20. Of course, instead of the clock voltages shown in FIG. 4, other clock voltages may also be used, for example, voltages which show more than two levels or voltages which show rather a sawtooth-like character as a function of time. The semiconductor layer 2 is set up at a level of approximately 20 volts, for example, via the output contact 32, as a result of which when information-containing charge carriers are lacking absent with the given voltage level of the electrodes 4–11 and the substrate 20 the semiconductor layer 2 is depleted throughout its thickness. When a signal in the form of majority charge carriers, so in the form of electrons, is supplied to the semiconductor layer 2, said signal will be stored in a part of the semiconductor layer 2 which is present opposite to an electrode having the largest positive voltage. At the instant $t_o$ (see FIG. 4) at which the electrode 6 is at 10 volts, the electrode 7 is at the highest potential as a result of the votage source 26 and the part which is present opposite to said electrode and is enclosed diagrammatically by the broken lines 16 is filled by signal-forming majority charge carriers, hence electrons.

The voltage which should be applied to the electrode 7 so as to keep together the quantity of charge stored in the region 6 depends, besides as regards the value of the charge, on the distance between the carhge and the electrode. According as said distance is larger, which means that the charge is capacitively coupled less strongly to the electrode, said voltage should be larger. By providing the more highly doped surface zone 17 at the surface 18 of the semiconductor layer 2 it is achieved that the greater part of the charge is concentrated near the surface 18, and hence very closely to the electrode 7, where the capacitive coupling to the electrode 7 is very large. As a result of this, the charge-coupled device can be operated with smaller clock voltages — with the same quantity of charge — than when a homogeneously doped epitaxial layer 2 is used. Moreover, due to the higher doping of the layer 17 the charge is concentrated very close to, it is true, but at a finite distance from the surface 18, as a result of which, at least in the case in which the semiconductor devices is not operated in accumulation, the possibility that charge is trapped in traps at the surface 18 where the concentration of such traps is generally much larger than in the interior of the layer 2, is considerably reduced.

At the instant denoted in FIG. 4 by $t_1$ the voltage $V_{24}$ drops to 0 volt, while $V_{22}$ reaches the level of 10 volts. As a result of this, the electrons stored in the part 16 of the semiconductor layer 2 are transported to the part of the semiconductor layer 2 opposite to the electrode 9 surrounded by the broken lines 28, the region 16 being depleted in the direction from the surface 18 to the substrate 20. The transport rate may be very high — with a high transport efficiency — in that, although the capacitive coupling between the charge and the electrodes as a result of the higher doping concentration of the surface zone 17 is large, the transport rate is mainly determined by the last fractions of charge still to be transferred. These last fractions are transferred deeply in the interior of the semiconductor layer 2, are hence coupled very weakly to the electrodes, and can therefore be transferred comparatively rapidly.

In the present embodiment, the lower doped adjoining part 19 of the layer 2 has a thickness of approximately 5 $\mu$m and a doping concentration of approximately $5\times 10^{14}$ atoms/cm$^3$, and the more highly doped upper surface zone 17 has a thickness of approximately 0.3 $\mu$m and a doping concentration of approximately $4\times 10^{16}$ atoms/cm$^3$. The width of the semiconductor layer 2 transverse to the direction of charge transport is approximately 20 $\mu$m and the width of the electrodes 4–11 in the direction of charge transport is approximately 10 $\mu$m. The quantity of charge which can be stored per stage (bit) of the charge-coupled device is approximately 0.15 p C, it being noted that this represents approximately the maximum charge with which spreading of the charge does not yet occur at the given voltages. Approximately 80 percent of said charge can be stored in the highly doped surface zone 17, so very closely to the electrodes, so that comparatively little voltage is necessary for said fraction, while only approximately 20 percent can be stored in the lower doped adjoining part 19, so at a larger distance from the electrodes.

The device can further be manufactured in manners known in semiconductor technology so that this need not be described in detail.

Figure 5:
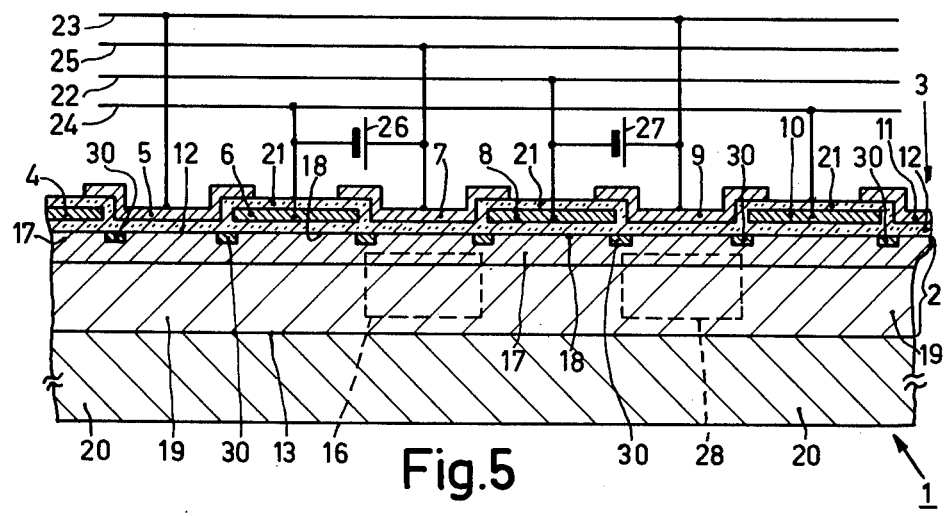
FIG. 5 is a diagrammatic cross-sectional view of a part of second charge-coupled device according to the invention.

As already explained, since the doping concentration of the semiconductor layer 2 is highest at the surface 18, the charge to be transported through the layer 2 is concentrated at a very small but finite distance from the surface 18. As a result of this, the influence is reduced of potential wells which may occur near the surface 18 between the electrodes 4–11 and in which charge might be retained. An embodiment of a charge-coupled device in which the occurrence of such potential wells can be prevented at least for the greater part will now be described with reference to FIG. 5. For that purpose, the device shown in FIG. 5 which further corresponds substantially to the device shown in FIG. 3, shows a small change relative to the device shown in FIG. 3. It is to be noted that in as far as the device shown in FIG. 5 corresponds to the device shown in FIG. 3, the same reference numerals are used in FIG. 5 as in FIG. 3. In the present embodiment, the semiconductor layer 2 which again consists of n-type silicon comprises p-surface surface zones 30. Viewed on the surface 18, said zones 30 are present between the electrodes 4–11 and extend from the surface 18 over a part of the thickness of the semiconductor layer 2 in the layer 2. During operation the zones 30 which may adjoin the p-type insulation zones surrounding the semiconductor layer 2 may be depleted and hence be charged negatively. The negative charge in the zones 30 prevents the formation of potential wells at the surface 18. The semiconductor device may furthermore be operated in the same manner as the semiconductor device in the preceding embodiment.

Also in manners known in semiconductor technology, the zones 30 may be provided, for example, by means of ion implantation.

Figure 6:
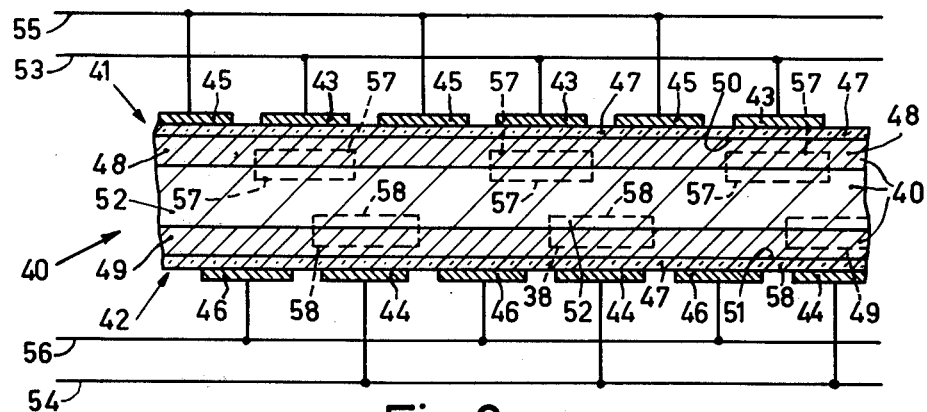
FIG. 6 is a diagrammatic cross-section view of a part of a third charge-coupled device according to the invention.

A further preferred embodiment of a charge-coupled device according to the invention, illustrated in FIG. 6, is characterized in that on two oppositely located sides the semiconductor layer has an electrode system for generating electric fields in the semiconductor layer, the semiconductor layer on each of the said sides having at least locally a surface zone of one conductivity type which, viewed each time from the associated side, is present below the electrode system and which is more highly doped than the adjoining part of the semiconductor layer and which extends in the layer only over a part of the thickness of the layer.

The electrode systems provided on either side may also comprise a number of electrodes separated from the semiconductor layer by barrier layers. The electrodes which are provided on one side may be present straight opposite to electrodes which are provided on the oppositely located side of the semiconductor layer, in which two oppositely located electrodes may be set up at the same clock voltage source as a result of which the charge transport from one stage to the next stage takes place mainly in a direction parallel to the semiconductor layer. However, it is also possible to operate a charge-coupled device according to the invention in which electrodes are provided on two sides in such manner that the charge during transport from one stage to a next stage crosses the semiconductor layer without otherwise contacting the surfaces of the semiconductor layer.

In this embodiment, a cross-sectional view of a part of which is shown diagrammatically in FIG. 6, the semiconductor layer 40 of n-type silicon has an electrode system with the electrodes 43–46 on two oppositely located sides 41 and 42. The electrodes 43–46 extend in a direction transverse to the direction of charge transport again transverse across the semiconductor layer 40 in a manner analogous to the electrodes 4–11 shown in FIG. 1 and are isolated from the semiconductor layer by a barrier layer 47 of silicon oxide. The electrodes 45–46 are constituted by metal layers of, for example, aluminum. Of course, other metals or semiconductor materials may also be used instead of aluminum.

The semiconductor layer 40 has two more highly doped surface zones 48 and 49 which extend from the surfaces 50 and 51 on the sides 41 and 42, respectively, in the semiconductor layer 40. The more highly doped surface zones 48 and 49 are isolated from each other by an adjoining intermediate part 52 of the semiconductor lyer 40 which has a lower doping than the surface zones 48 and 49. The lower doped part 52 may adjoin the surfaces 50 and 51 in places which, viewed on the surface 50 and 51, are present between the electrodes 43–46. In the present embodiment, however, the layer-shaped more highly doped surface zones 48 and 49 extend along the whole surfaces 50 and 51.

The electrodes 43–46 are provided so that, viewed in projection in a direction transverse to the main surface 50, 51, an electrode which is provided on one side of the layer 40 partly overlaps two juxtaposed electrodes which are provided on the oppositely located side.

The electrodes 43–46 are subdivided into four groups in which the electrodes belonging to a first group are denoted by 43, the electrodes belonging to a second group are denoted by 44, the electrodes belonging to a third group are denoted by 45 and the electrodes belonging to the fourth group are denoted by 46.

The electrodes belonging to the same group are connected together by the conductors 53–56 shown diagrammatically only in FIG. 6. It is to be noted that, since only two groups of electrodes are provided on each of the sides 41, 42, the electrodes can be connected together by conductors which need not cross each other.

During operation (see FIG. 7) the conductors (or clock lines) are connected to clock voltage sources by means of which the clock voltages $V_{43}$, $V_{44}$, $V_{45}$ and $V_{46}$ can be applied to the electrodes 43, 44, 45 and 46, respectively. Like the voltages $V_{22}$ and $V_{24}$ in FIG. 4, the clock voltages $V_{43}$–$V_{46}$ the variation of which is shown diagrammatically in FIG. 7 as a function of the time $t$, can show two levels. In the present embodiment however, the voltages $V_{43}$–$V_{46}$ show three voltage levels as a result of which it can be prevented during the transport that charge flows in the wrong direction.

In order to explain the operation of this type of semiconductor device it is assumed again that, apart from possible information-forming charge in the form of majority charge carriers, the semiconductor layer 40 is further fully depleted.

Figure 7:
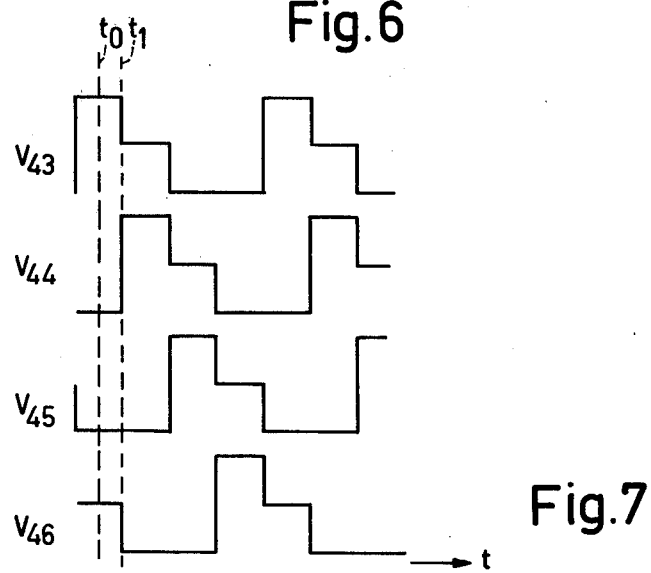
FIG. 7 shows diagrammatically the clock voltages which can be placed on the electrodes in the device shown in FIG. 6 as a function of time.

Start is made, for example, from the instant denoted in FIG. 7 by $t_o$ at which the electrodes 43 are at a positive potential relative to the remaining electrodes 44, 45 and 46. As a result of the voltage differences between the electrodes 43 on the one hand and the electrodes 44, 45, 46 on the other hand, information-forming electrons are stored near the electrodes 43 in the regions 57 denoted by broken lines.

At the instant $t_1$, the electrodes 44 are placed at a positive potential relative to the remaining electrodes so that the electrons stored in the regions 57 flow in the direction of the electrodes 44 via the interior of the semiconductor layer 40 and are stored near the electrodes 44 in regions 58 which are also denoted by broken lines.

In the subsequent phases of the clock voltages shown in FIG. 7, the electrons are transported in an analogous manner from the electrodes 44 in the direction of the electrodes 45 and subsequently from the electrodes 45 in the direction of the electrodes 46, and so on. The displacement of the information-forming charge from one stage to a subsequent stage of the charge-coupled device therefore has a component transverse to the semiconductor layer 40 in addition to a component parallel to the semiconductor layer 40, in which the charge moves alternatively from one side to the other of the sides 41, 42.

As shown in FIG. 6, the information-containing regions 57 and 58, respectively, are concentrated near the interface between the more highly doped surface zone 48 and the lower doped adjoining part 52, respectively the more highly doped surface zone 49 and the lower doped part 52. As a result of the higher doping of the surface zones 48 and 49, however, the greater part of the charge can be stored in the regions 48 and 49 and hence very close to the electrodes.

In addition, the maximum charge at which accumulation of charge does just not yet occur may be comparatively large as a result of which the charge in this type of device also can be stored and/or transported at a finite distance from the surfaces 50 and 51 without this imposing serious restrictions upon the maximum quantity of charge to be transported and/or the clock voltages to be applied to the electrodes 43–46.

In the present embodiment the said adjoining lower-doped part 52 has a thickness of approximately 5 $\mu$m and a doping concentration of approximately $10^{14}$ atoms/cm$^3$, while the more highly doped surface zones 48 and 49 are formed by layers having a thickness of approximately 0.3 $\mu$m and a doping concentration of $5 \times 10^{16}$ atoms/cm$^3$.

Figure 8:
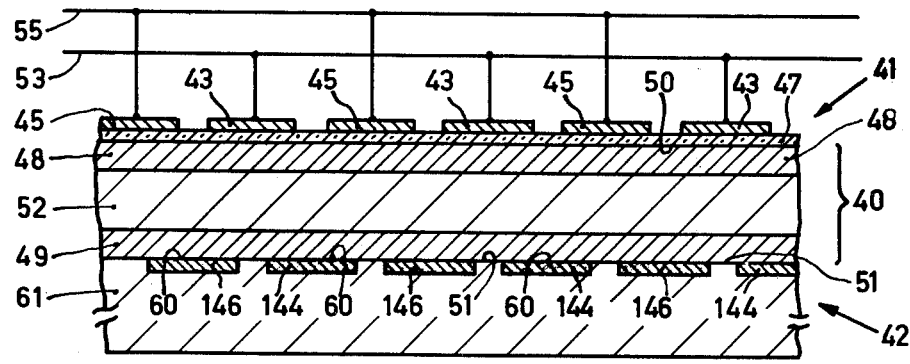
FIG. 8 is cross-sectional view of a further embodiment of a device according to the invention.

Instead of electrodes which are separated from the semiconductor layer by an insulating layer, electrodes in teh form of semiconductor zones of the opposite conductivity type which are isolated from the semiconductor layer by a reverse p-n junction may also be used advantageously. Such electrodes may in particular be used advantageously in the case in which electrodes are provided on two oppositely located sides of the semiconductor layer, in which the electrodes on one of the said sides may be constructed in the form of buried zones of the opposite conductivity type between the semiconductor layer and a substrate of the same conductivity type as the semiconductor layer. FIG. 8 is a cross-sectional view of a device according to the invention having such an electrode system. This charge-coupled device corresponds for the greater part to the device shown in FIG. 6 and therefore corresponding parts are referred to by the same reference numerals. The device again comprises a semiconductor layer 40 of n-type silicon which has electrodes (43, 45; 144, 146) on the two oppositely located sides (41, 42). On the side 41 the semiconductor layer 40 has the n-type surface zone 48 adjoining the surface 50 and on the side 52 it has the n-type surface zone 49 adjoining the surface 51. Viewed in the direction of thickness, the zones 48 and 49 are isolated from each other by the adjoining n-type part 52 which has a lower doping than the zones 48 and 49.

The zones 48 and 49 are present very close to the electrodes and therewith cause a strong capacitive coupling between the greater part of the charge to be transported through the layer 40 and the electrodes with all the advantages already described.

On the side 41, the metal electrodes 43, 45 are provided which are separated from the more highly doped surface zone 48 by a silicon oxide layer grown on the surface 50.

On the side 42 the electrodes 144, 146 in the form of p-type zones are provided which adjoin the surface 51 of the semiconductor layer 40. The zones 144, 146 are constructed as buried zones between the n-type semiconductor layer 40 and an n-type substrate 61. During operation of the semiconductor device which may further be operated in a manner analogous to that of the semiconductor device shown in FIG. 6, the substrate is placed at such a positive reverse voltage relative to the electrodes 144, 146 that a continuous depletion zone is formed across the p-n junction between the p-type zones 144, 146 and the surrounding n-type semiconductor material, said zone preventing conductivity between the substrate 61 and the semiconductor layer 40.

For the manufacture of the device shown in FIG. 8 the n-type silicon substrate 61 may be used as the starting material. By means of known methods, p-type zones which are to form the electrodes 144, 146, are provided at the surface 51. By means of known methods, the regions 49, 52 and 48 in the form of three epitaxial layers of the desired thickness and the desired doping concentration may then be provided one after the other. The insulation of the semiconductor layer 40 in a lateral direction may in this embodiment advantageously be formed by a layer of insulating material which is inset in the semiconductor layer 40 from the surface 50.

Figure 9:
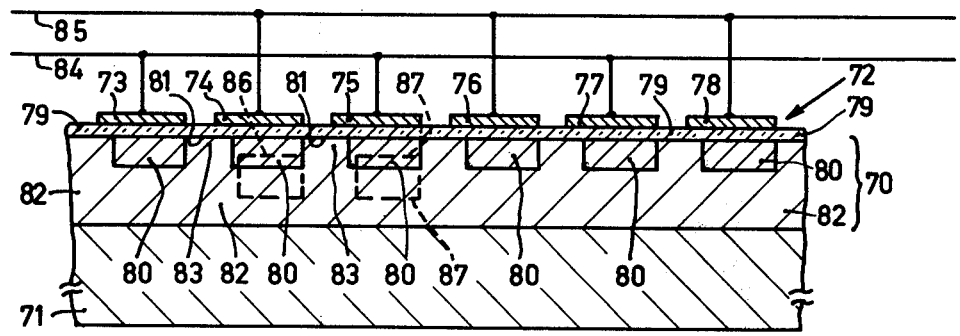
FIG. 9 is a cross-sectional view of still a further device according to the invention.

The charge-coupled device shown in FIG. 3 may be operated as a two-phase system as a result of the asymmetry obtained by means of the voltage source 26 and 27. With reference to FIG. 9, another embodiment will now be described of a device to be operated as a two-phase system, in which the asymmetry is incorporated in the semiconductor body itself.

FIG. 9 illustrates a further embodiment of the invention wherein, advantageously, the semiconductor layer may comprise a number of surface zones of one conductivity type which are separated laterally from each other and which are more highly doped than the adjoining part of the semiconductor layer, extend in the layer only over a part of the thickness of the semiconductor layer, and are present below the electrodes.

A preferred embodiment of a charge-coupled device according to the invention is characterized in that in a direction parallel to the direction of transport, the electrodes project to over the edge of the underlying more highly doped surface. As a result of this, an asymmetry and hence a preferential direction is incorporated in the system which enables the operation of such a device with only two clock-voltage sources — or as a two phase system. The necessary overlap between the electrodes and the lower doped intermediate parts of the semiconductor layer adjoining the surface zones, need not mean a serious restriction of the quantity of charge which can be stored in the more highly doped surface zones, since said overlap need occupy only comparatively little surface area. Advantageously, the surface zones extend under at least half and preferably at least three quarters of the surface of the electrodes provided above the more highly doped surface zones.

The charge-coupled devise shown in a cross-sectional view in FIG. 9, again comprises a semiconductor layer 70 of n-type silicon which is provided in the form of an epitaxial layer on the substrate 71 of p-type silicon. The semiconductor layer 70 has a thickness and a doping concentration in which, in a direction transverse to the layer, an electric field can be applied in which, while avoiding breakdown, a depletion zone can be formed throughout the thickness of the layer. Aluminum electrodes 73–78 which are separated from the semiconductor layer 70 by an insulating layer 79 of silicon oxide, are provided on the side 72 of the layer. The electrodes 73–78 extend in a direction transverse to the direction of charge transport transversely across the semiconductor layer 70 in a manner analogous to the electrodes 4–11 in FIG. 1 in the first embodiment.

The semiconductor layer 70 comprises a number of n-type surface zones 80, which extend down from the surface 81 of the semiconductor layer 70 over a part of the thickness of the layer and have a higher doping than the adjoining lower doped region 82. The surface zones 80 each form with a lower doped region 82 a double layer.

The more highly doped regions 80 are separated from each other laterally by intermediate parts 83 of the adjoining lower doped region 82 and, viewed from the side 72, are each present below an electrode.

As is furthermore obvious from FIG. 9, the electrodes, in a direction parallel to the direction of charge transport, each extend to over the edge of the underlying more highly doped surface zones 80, the lower doped adjoining parts 83 extending to below the electrodes 73–78. As a result of this and without the help of extra external voltage sources, an asymmetry is incorporated in the system which enables the operation of the charge-coupled device as a two-phase system. For that purpose, the electrodes 73–78 are subdivided into two groups, in which the electrodes 73, 75 and 77 belong to a first group of electrodes which are connected together by the conductor (or clock line) 84, and in which the electrodes 74, 76 and 78 belong to a second group of electrodes which are connected together by the conductor or clock line 85. The electrodes may be interconnected by means of conductors which need not cross each other.

The device may furthermore be operated in the same manner as the device according to the first embodiment, in which the conductors 84 and 85 may be connected to clock voltage sources by means of which a clock voltage of the type of $V_{24}$ in FIG. 4 can be applied to the electrodes 74, 76 and 78 and a clock voltage of the type $V_{26}$ in FIG. 4 can be applied to the electrodes 73, 75 and 77.

During operation, the layer 70 is again fully depleted, not counting possible information-containing charge packets in the form of electrons which will be stored in the semiconductor layer 70 opposite to the electrodes having the most positive voltage. Such a charge packet 86 is shown by way of example in FIG. 9 and is denoted by broken lines. By reversing the polarity of the voltage difference between the electrodes 74 and 75, the charge carriers in the region 86 are transferred to the right in FIG. 9 to the region 87 which is also shown in broken lines and is present opposite to the electrodes 75 mainly again via the interior of the semiconductor layer 70. As will be noted, the higher doped surface zones 80 are located under the downstream electrode portions which are nearest the read-out means.

The charge can now be stored again both in the more highly doped surface regions 80 and in the lower doped adjoining region 82. However, as a result of the higher doping of the zones 80, the greater part of the charge will be stored in the regions 80 — so very close to but at a finite distance from the surface 81 — and hence require comparatively little voltage. Since in addition the more highly doped surface zones extend only below a part of the electrodes in which the parts 83 of the adjoining lower doped part 82 extend to below the upstream portions of the electrodes, it is achieved in addition that the device can be operated as a two-phase system without the use of extra voltage sources.

The thickness and the doping concentration of the more highly doped surface zones 80 and the adjoining lower doped part 82 below the more highly doped zones may be of the same order as the thicknesses and the doping concentrations of the more highly doped surface zone 17 and the adjoining lower doped part 19 of the semiconductor double layer 2 in the first embodiment, respectively. The device may be operated with voltages which are comparable to those with which a device according to the first embodiment is operated. The semiconductor device may be manufactured by first providing an epitaxial layer on the p-type substrate so as to obtain the lower-doped part 82. By means of conventionally used methods, the doping concentration of the epitaxial layer may then be increased locally so as to obtain the more highly doped surface zones 80, after which the silicon oxide layer 78 and the electrodes 73–78 are provided on the surface 81 of the epitaxial layer.

A further preferred embodiment of a charge-coupled device according to the invention which can be operated as a two-phase system (hence only with two clock voltage sources) is characterized in that, viewed from the said side, the electrodes are present above a more highly doped surface zone only alternately and the other electrodes are present above the said adjoining part of the semiconductor layer. During operation, for example, each electrode present above a more highly doped surface zone may be connected to a preceding electrode — viewed in the charge transport direction — and constitute with said electrode a stage (or bit) of the charge-coupled device. This is illustrated in FIG. 10.

Figure 10:
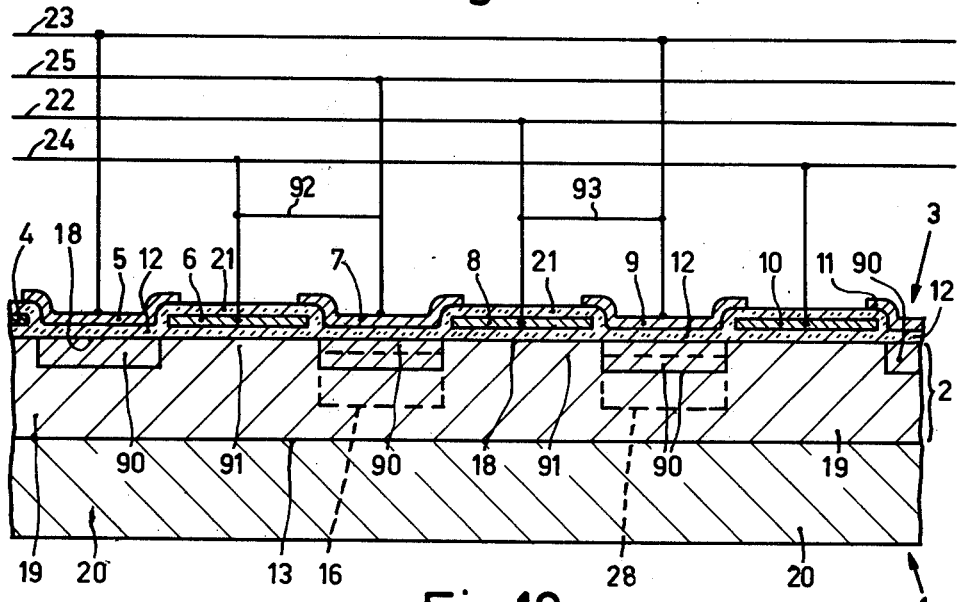
FIG. 10 is a cross-sectional view of still another embodiment of a charge-coupled device according to the invention.

The cross-sectional view of FIG. 10 shows a further embodiment of a charge-coupled device according to the invention which may be operated as a two-phase system. This device again corresponds for the greater part to the first embodiment described (see FIG. 3) and corresponding parts are therefore referred to by the same reference numerals.

The device according to the present embodiment differs from the charge-coupled device shown in FIG. 3 in that the semiconductor layer 2 (again of n-type silicon) has a number of n-type surface zones 90 on the side 3 which zones, viewed from the side 3, are separated from each other laterally by parts 91 which belong to the adjoining lower doped part 19 of the semiconductor layer 2. The surface zones 90 again have a higher doping than the adjoining part 19 of the semiconductor layer 2.

Moreover, in the present embodiment and viewed from the side 3, the electrodes 4–11 are present only alternately above a more highly doped surface zone 90, while the other intermediately located electrodes are present above the adjoining lower-doped part (19, 91). As shown in the cross-sectional view of FIG. 10, the electrodes 5, 7, 9 and 11 are present above the surface zones 90, the electrodes 4, 6, 8 and 10, however, are present above the lower-doped intermediately located parts 91 which belong to the said adjoining part 19 of the semiconductor layer 2.

This asymmetry incorporated in the semiconductor body again produces a preferential direction (to the right in FIG. 10) in the system which again enables the device to be operated with only two phases. For that purpose, the electrodes 6, 10 and so on which belong to the clock line 24, for example, are connected to the electrodes 7, 11 and so on which belong to the clock voltage line 25 by means of the connection 92 which is shown diagrammatically.

In the same manner, the electrodes 4, 8 and so on which belong to the clock voltage line 22 are connected to the electrodes 5, 9 and so on which belong to the clock-voltage line 23 via the conductor 93.

The device may be operated in a manner analogous to the device according to the first embodiment, in which the voltage $V_{22}$ shown in FIG. 4 can be applied to the clock lines 22, 23 and the voltage $V_{24}$ shown in FIG. 4 can be applied to the clock lines 23, 25 and in which information-forming electrons are alternately stored in regions 16 of the semiconductor layer 2 opposite to the electrodes 7 belonging to the clock line 25 and in regions 28 of the semiconductor layer 2 opposite to the electrodes 9 belonging to the clock line 23.

The greater part of the charge can each time be stored again very close to the electrodes 7, 9 and thus requires comparatively little voltage. Considering each pair of electrodes (eg. 6, 7 and 8, 9) associated with each stage, it will be noted that the highly doped surface regions 90 are located under the downstream portion of the electrode pair.

For the manufacture of the device, the p-type substrate 20 on which the n-type semiconductor layer 22 is provided in the form of an epitaxial layer the doping concentration of which is equal to that of the said adjoining part 19, is used as a starting material, the electrodes 4, 6, 8, 10 and so on consisting of polycrystalline silicon are then first provided. The layer 2 may then be provided with the more highly doped surface zones 90, for example, by means of ion implantation, in which the electrodes already present may serve as a mask.

After providing the surface zones 90, the electrodes 5, 7, 9, 11 and so on may be provided in a manner conventionally used in semiconductor technology in the form of conductive layers of a suitable material, for example aluminum.

The surface zones 90, the electrodes 4, 6, 8 and 10, and the electrodes 5, 7, 9 and 11 can mutually be aligned very accurately by using the electrodes 4, 6 and so on of polycrystalline silicon as a masking layer during providing the surface zones 90.

It will be obvious that the invention is not restricted to the embodiments described but that many variations are possible to those skilled in the art without departing from the scope of this invention.

For example, instead of an n-type semiconductor layer, a p-type semiconductor layer may also be used in which majority charge carriers in the form of holes can be transported through the semiconductor layer as information-containing charge. Instead of silicon the semiconductor layer may consist of other semiconductor materials, for example, germanium or AIII - BV compounds. It is furthermore possible for the insulating layer which separates the electrodes from the semiconductor material to consist of materials other than silicon oxide, for example, silicon nitride or aluminum oxide or combinations of layers of different insulating materials provided one upon the other.

The information-forming charge carriers may be introduced into the semiconductor layer by generation of charge carriers as a result of radiation, in which the minority charge carriers can be dissipated via the substrate (see, for example, the first embodiment).

It will furthermore be obvious that an information-containing signal can also be represented by a lack of charge carriers instead of by the quantity of charge carriers present.

In order to obtain the asymmetry in the system as a result of which the semiconductor device can be operated as a two-phase system, further means, for example, an insulating layer of a varying thickness covering the semiconductor layer, may be used. Of course, the invention may also be applied to semiconductor devices which can be operated as a three-phase system, that is to say with three clock voltage sources.

What is claimed is:

1. A bulk-channel charge transfer device comprising an elongated semiconductor layer of one-type conductivity, means for isolating the semiconductor layer, means to locally introduce into the semiconductor layer information in the form of majority charge carriers and means to read-out said information elsewhere in the layer, said semiconductor layer having a thickness measured perpendicularly to a cooperating electrode system and a doping concentration and being maintained at a potential such that it is fully depleted throughout its thickness in the absence of locally-introduced free charge carriers, and a cooperating electrode system comprising plural electrodes separated by a barrier layer from the semiconductor layer and located at least at one side of the semiconductor layer and responsive to the application of potentials thereto to capacitively generate electric fields in the semiconductor layer for storing charge carriers at spaced sites within the layer below its surface and for transporting the charge carriers through the layer below its surface in the longitudinal direction toward the read-out means, said semiconductor layer comprising at least locally below the electrode system a one-type conductivity surface zone which has a doping concentration at least about 100 times greater than that of the underlying adjoining part of the one-type semiconductor layer, said higher doped surface zone having a thickness substantially less than the overall thickness of the one-type layer and being fully depleted during normal operation in the absence of locally introduced free charge carriers, the semiconductor layer portions under substantially all of each electrode having a substantially uniform sheet resistance.

2. A charge transfer device as claimed in claim 1 wherein the semiconductor layer comprises an epitaxial layer of one-type conductivity on a semiconductor substrate of the opposite-type conductivity.

3. A charge transfer device as claimed in claim 1 wherein the higher doped surface zone has a thickness less than half that of the semiconductor layer.

4. A bulk-channel charge transfer device comprising an elongated semiconductor layer of one-type conductivity, means for isolating the semiconductor layer, means to locally introduce into the semiconductor layer information in the form of majority charge carriers and means to read-out said information elsewhere in the layer, said semiconductor layer having a thickness measured perpendicularly to a cooperating electrode system and a doping concentration and being maintained at a potential such that it can be fully depleted throughout its thickness in the absence of locally-introduced free charge carriers, and a cooperating electrode system located at least at one side of the semiconductor layer and responsive to the application of potentials thereto to capacitively generate electric fields in the semiconductor layer for storing charge carriers at spaced sites within the layer below its surface and for transporting the charge carriers through the layer below its surface in the longitudinal direction toward the read-out means, said semiconductor layer comprising a one-type conductivity surface zone which has a doping concentration at least about 100 times greater than that of the underlying adjoining part of the one-type semiconductor layer, said higher doped surface zone having a thickness substantially less than the overall thickness of the one-type layer and extending uniformly across the top of the semiconductor layer.

5. A charge transfer device as claimed in claim 4 wherein the less-highly doped adjoining part of the semiconductor layer comprises a first epitaxial layer and the higher doped surface zone comprises a second epitaxial layer on the first epitaxial layer.

6. A charge transfer device as claimed in claim 5 wherein the electrode system comprises plural spaced electrodes, and opposite-type conductivity surface zones are located in the semiconductor layer under the gaps between the electrodes parallel to the transport direction.

7. A charge transfer device as claimed in claim 4 wherein the thickness of the surface zone is less than half the thickness of the semiconductor layer.

8. A bulk-channel charge transfer device comprising an elongated semiconductor layer of one-type conductivity, means for isolating the semiconductor layer, means to locally introduce into the semiconductor layer information in the form of majority charge carriers and means to read-out said information elsewhere in the layer, said semiconductor layer having a thickness measured perpendicularly to a cooperating electrode system and a doping concentration and being maintained at a potential such that it can be fully depleted throughout its thickness in the absence of locally-introduced free charge carriers, and a cooperating electrode system located on opposite sides of the semiconductor layer and responsive to the application of potentials thereto to capacitively generate electric fields in the semiconductor layer for storing charge carriers at spaced sites within the layer below its surface and for transporting the charge carriers through the layer below its surface in the longitudinal direction toward the read-out means, said semiconductor layer comprising on opposite sides and spaced from one another one-type conductivity surface zones which are more highly doped than the underlying adjoining part of the one-type semiconductor layer, said more highly doped surface zones having a thickness substantially less than the overall thickness of the one-type layer and extending uniformly across the top of the semiconductor layer.

9. A bulk-channel charge transfer device comprising an elongated semiconductor layer of one-type conductivity, means for isolating the semiconductor layer, means to locally introduce into the semiconductor layer information in the form of majority charge carriers and means to read-out said information elsewhere in the layer, said semiconductor layer having a thickness measured perpendicularly to a cooperating electrode system and a doping concentration and being maintained at a potential such that it is fully depleted throughout its thickness in the absence of locally-introduced free charge carriers, and a cooperating electrode system comprising plural electrodes separated by a barrier layer from the semiconductor layer and located at least at one side of the semiconductor layer and responsive to the application of two-phase clock voltages thereto to capacitively generate electric fields in the semiconductor layer for storing charge carriers at spaced sites within the layer below its surface and for transporting the charge carriers through the layer below its surface in the longitudinal direction toward the read-out means, said semiconductor layer comprising below the electrode system plural spaced one-type conductivity surface zones each more highly doped than the underlying adjoining part of the one-type semiconductor layer, said more highly doped surface zones each having a doping concentration at least about 100 times greater than that of the adjoining part of the one-type layer and a thickness substantially less than the overall thickness of the one-type layer and being fully depleted during normal operation in the absence of locally introduced free charge carriers, the electrodes being located relative to the more highly doped surface zones such that each electrode extends over a surface zone and beyond its edge remote from the read-out means parallel to the transport direction.

10. A charge transfer device as claimed in claim 9 wherein the surface zone has a thickness less than half that of the semiconductor layer.

11. A bulk-channel charge transfer device comprising an elongated semiconductor layer of one-type conductivity, means for isolating the semiconductor layer, means to locally introduce into the semiconductor layer information in the form of majority charge carriers and means to read-out said information elsewhere in the layer, said semiconductor layer having a thickness measured perpendicularly to a cooperating electrode system and a doping concentration and being maintained at a potential such that it is fully depleted throughout its thickness in the absence of locally-introduced free charge carriers, and a cooperating electrode system comprising plural electrodes separated by a barrier layer from the semiconductor layer and located at least at one side of the semiconductor layer and responsive to the application of two-phase clock voltages thereto to capacitively generate electric fields in the semiconductor layer for storing charge carriers at spaced sites within the layer below its surface and for transporting the charge carriers through the layer below its surface in the longitudinal direction toward the read-out means, said semiconductor layer comprising below the electrode system plural spaced one-type conductivity surface zones each having a doping concentration at least about 100 times greater than that of the underlying adjoining part of the one-type semiconductor layer, said higher doped surface zones each having a thickness substantially less than the overall thickness of the one-type layer and being fully depleted during normal operation in the absence of locally introduced free charge carriers, the electrodes being located relative to the more highly doped surface zones such that alternate electrodes extend over a higher doped surface zone and the intervening electrodes extend over lower-doped portions of the semiconductor layer at the surface.

12. A charge transfer device as claimed in claim 11 wherein the surface zone has a thickness less than half that of the semiconductor layer.

13. A bulk-channel charge transfer device comprising an elongated semiconductor channel of one-type conductivity, means for isolating the semiconductor channel, means to locally introduce into the semiconductor channel information in the form of majority charge carriers and means to read-out said information elsewhere in the channel, said semiconductor channel having a thickness measured perpendicularly to a cooperating electrode system and a doping concentration and being maintained at a potential such that it is fully depleted throughout its thickness in the absence of locally-introduced free charge carriers, and a cooperating electrode system comprising plural electrodes separated by a barrier layer from the semiconductor channel and located at least at one side of the semiconductor channel and responsive to the application of potentials thereto to capacitively generate electric fields in the semiconductor channel for storing charge carriers at spaced sites within the channel below its surface and for transporting the charge carriers through the channel below its surface in the longitudinal direction toward the read-out means, said semiconductor channel forming a double layer comprising upper layer portions at the surface and adjoining lower layer portions both of the same one-type conductivity, said upper layer portions occupying at least substantial portions of the surface area under the storage electrode portions closer to the read-out means in the transport direction, said upper layer portions each having a one-type dopant concentration greater than ten times that of said lower layer portions and each having a thickness less than one-half the thickness of the double-layer such that during application to the electrodes of charge storage potentials, large packets of charge carriers present are mainly stored in said upper layer portions, and during application to the electrodes of charge transfer potentials, the last charge fractions of the packets are mainly transferred through said lower layer portions, said upper layer portions being fully depleted during normal operation in the absence of locally introduced free charge carriers.

14. A charge transfer device as claimed in claim 13 wherein the doping concentration in the upper surface layer portions is at least about 100 times greater than that of the lower layer portions of the double layer, and the thickness of the upper surface layer portions is less than one-tenth that of the double layer.

15. A charge transfer device as claimed in claim 13 wherein the upper surface layer portions extend under at least the half of the storage electrodes closer to the read-out means in the transport direction.

16. A charge-transfer device as claimed in claim 13 wherein the upper surface layer portions form a continuous surface layer extending under all of the electrodes.

* * * * *

UNITED STATES PATENT AND TRADEMARK OFFICE
CERTIFICATE OF CORRECTION

PATENT NO. : 4012759
DATED : March 15, 1977
INVENTOR(S) : LEONARD JAN MARIA ESSER It is certified that error appears in the above-identified patent and that said Letters Patent are hereby corrected as shown below:

Col. 2, line 10, "ing" should read -- ion --.

Col. 5, line 29, after "of" (second occurrence) and before "provided" should read -- mutually different doping concentrations, which layers are --.

Col. 6, line 27, "in" should read -- is --.

line 27, after "characterized" should read -- in that the semiconductor layer has surface zones of the --.

line 38, "chargecoupled" should read -- charge-coupled --

Col. 9, line 32, "carhge" should read -- charge --.
Col. 13, line 3, "teh" should read -- the --.

Signed and Sealed this

Twenty-fifth Day of October 1977

[SEAL]

Attest:

RUTH C. MASON
Attesting Officer

LUTRELLE F. PARKER
Acting Commissioner of Patents and Trademarks